United States Patent
Gallhauser et al.

(10) Patent No.: US 10,837,992 B2
(45) Date of Patent: Nov. 17, 2020

(54) RF CABLE AND CABLE-BOUND PATH LOSS DETERMINATION METHOD

(71) Applicant: Rohde & Schwarz GmbH & Co. KG, Munich (DE)

(72) Inventors: Markus Gallhauser, Freising (DE); Matthias Jelen, Munich (DE); Martin Oetjen, Gröbenzell (DE); Martin Roth, Starnberg (DE); Waldemar Henrich, Neubiberg (DE); Esmeralda Strobel, Munich (DE); Simon Schelkshorn, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 30 days.

(21) Appl. No.: 16/419,159

(22) Filed: May 22, 2019

(65) Prior Publication Data

US 2020/0049749 A1    Feb. 13, 2020

(30) Foreign Application Priority Data

Aug. 8, 2018   (EP) ................................. 18187976

(51) Int. Cl.
  *G01R 27/26*  (2006.01)
  *H01R 13/6592*  (2011.01)
  *H01R 13/66*  (2006.01)

(52) U.S. Cl.
  CPC ..... *G01R 27/2688* (2013.01); *H01R 13/6592* (2013.01); *H01R 13/6683* (2013.01)

(58) Field of Classification Search
  CPC ............ G01R 27/2688; H01R 13/6592; H01R 13/6683
  See application file for complete search history.

(56) References Cited

U.S. PATENT DOCUMENTS

| 2,575,799 A | 11/1951 | Doherty et al. |
| 3,197,696 A | 9/1961 | Bibo |

(Continued)

FOREIGN PATENT DOCUMENTS

| CN | 207233420 U | 4/2018 |
| EP | 3 273 257 A1 | 1/2018 |

(Continued)

OTHER PUBLICATIONS

Extended European Search Report for European Patent Application No. 18187976.8, dated Jan. 3, 2019, 11 pages.

(Continued)

*Primary Examiner* — Reena Aurora
(74) *Attorney, Agent, or Firm* — Westman, Champlin & Koehler, P.A.

(57) ABSTRACT

An RF cable includes a connector housing having an RF signal output interface, a cable body having a first end portion connected to the connector housing and a second end portion comprising an RF signal input interface, an RF signal transmission path formed from the RF signal input interface through the cable body and the connector housing to the RF signal output interface, and a power measurement device integrated into the connector housing and configured to measure a power value of an RF signal transmitted through the RF signal transmission path. The RF cable further includes a measurement signal output interface, and a measurement signal transmission line connecting the power measurement device to the measurement signal output interface, the power measurement device being configured to output a measurement signal indicating the measured power value of the RF signal at the measurement signal output interface.

9 Claims, 1 Drawing Sheet

(56) References Cited

U.S. PATENT DOCUMENTS

| | | | |
|---|---|---|---|
| 3,678,381 A | | 7/1972 | Beaudry |
| 5,414,343 A | * | 5/1995 | Flaherty ................. G01R 31/50 |
| | | | 324/66 |
| 5,504,811 A | * | 4/1996 | Kiko ........................ H04B 3/36 |
| | | | 379/345 |
| 5,570,028 A | * | 10/1996 | Sperlazzo .............. G01R 31/58 |
| | | | 324/528 |
| 2007/0222539 A1 | | 9/2007 | Antkowiak |
| 2010/0112866 A1 | | 5/2010 | Friedhof et al. |
| 2011/0077884 A1 | | 3/2011 | Bowman |
| 2011/0161050 A1 | | 6/2011 | Montena et al. |
| 2012/0293390 A1 | | 11/2012 | Shoemaker et al. |
| 2016/0344490 A1 | | 11/2016 | Foegelle |

FOREIGN PATENT DOCUMENTS

| | | |
|---|---|---|
| JP | 2002-122618 A | 4/2002 |
| WO | 2009/126254 A2 | 10/2009 |

OTHER PUBLICATIONS

Lee, Yeou-Song (Brian) et al., "Design of Inline Power Sensors and Performance Evaluation", Anritsu Company, 978-1-4244-3443-5/09/$25.00 © 2009 IEEE, BNSDOCID: <XP_31540645A_I_>, 6 pages.

\* cited by examiner

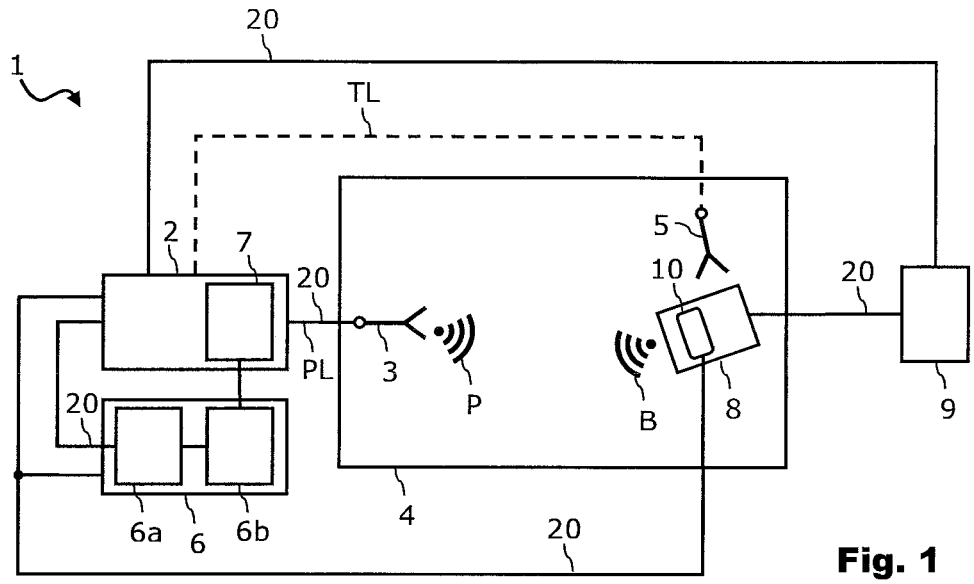
Fig. 1
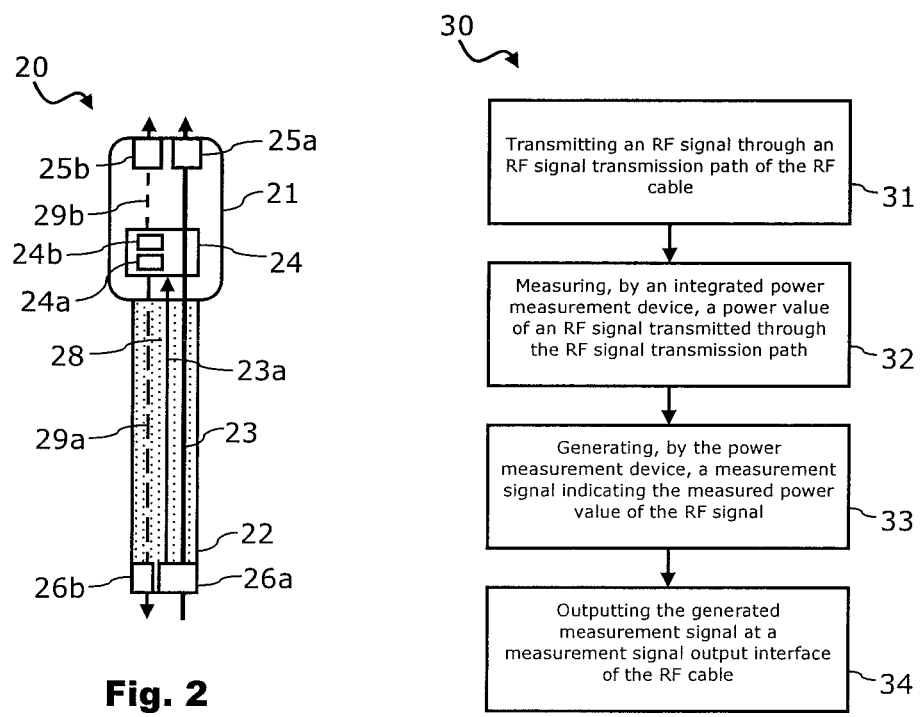
Fig. 2
Fig. 3

RF CABLE AND CABLE-BOUND PATH LOSS DETERMINATION METHOD

CROSS-REFERENCE TO RELATED APPLICATION(S)

This application claims priority to European Patent Application No. 18187976.8, filed Aug. 8, 2018, the content of which is hereby incorporated by reference in its entirety.

FIELD OF THE INVENTION

The present invention relates to a radio-frequency (RF) cable capable of determining electric power lost during transmission of RF signals through the RF cable. Moreover, the present invention relates to a method for determining cable-bound path loss. Such methods and RF cables may in particular be employed in testing systems for radio communication and radio interface testing of mobile communication devices.

BACKGROUND OF THE INVENTION

Electronic equipment, such as mobile communication devices, is subject to various electronic tests after production. Such tests are generally necessary to ensure proper configuration, calibration and functionality of various elements of the devices under test (DUT). For testing purposes, specific testing devices are employed which simulate a testing environment under predefined testing conditions. For example, testing devices may employ one or more specific testing routines with predefined testing schedules. Those testing schedules regularly involve input of particular test signal sequences into the DUT and/or reception of responses to testing signals input to the DUT. Such responses may be evaluated for consistency, constancy, timeliness and other properties of an expected behaviour of the DUT.

Testing signals are transmitted between testing equipment and the DUT, typically using cables. RF signals transmitted on those cables are attenuated on their way from the testing equipment to the DUT and back. In order to compensate for varying path losses, estimates or measures of the actual path losses experienced in the specific test setting need to be known in the testing equipment.

One possibility is to specifically perform measurements for the involved cables in the specific settings. For example, separate path loss determination equipment may be connected to the cables used. In order to perform separate measurements, the cables need to be detached from the test setting, leading to more complicated and expensive procedures for preparing accurate test schemes.

Other approaches try to obviate the need for separate measurement equipment. For example, document US 2011/0077884 A1 discloses a signal retrieval circuit formed within a disk located within a coaxial cable connector, the signal retrieval circuit being capable of monitoring signal parameters of signals transmitted through the coaxial cable connector. US 2010/0112866 A1 discloses a system and a method for sensing information such as voltage, current or data that is being transmitted through a connector. US 2011/0161050 A1 discloses a coaxial cable connector with an internal physical parameter sensing circuit configured to sense a physical parameter of the connector and a status output component.

It would, however, be desirable to find solutions for more easily and comfortably determining path losses in RF cables, for example RF cables connecting a testing device with a device under test or testing equipment among each other.

SUMMARY OF THE INVENTION

According to the disclosure of present invention RF cables and methods for determining cable-bound path losses may be implemented. Particularly, such RF cables and methods may be applied in testing systems for mobile communication devices.

Specifically, according to a first aspect of the invention, an RF cable, for example for connecting testing equipment to a mobile communication device under test, includes a connector housing having an RF signal output interface, a cable body having a first end portion connected to the connector housing and a second end portion comprising an RF signal input interface, an RF signal transmission path formed from the RF signal input interface through the cable body and the connector housing to the RF signal output interface, and a power measurement device integrated into the connector housing and configured to measure a power value of an RF signal transmitted through the RF signal transmission path. The RF cable further includes a measurement signal output interface, and a measurement signal transmission line connecting the power measurement device to the measurement signal output interface, the power measurement device being configured to output a measurement signal indicating the measured power value of the RF signal at the measurement signal output interface.

According to a second aspect of the invention, a testing system for testing one or more mobile communication devices comprises a test controller comprising a signal generator and analyzer, a testing chamber, one or more mobile communication devices under test placed in the testing chamber, and one or more RF cables according to the first aspect of the invention, the one or more RF cables interconnecting the test controller, the testing chamber and the one or more mobile communication devices under test.

According to a third aspect of the invention a cable-bound path loss determination method includes transmitting an RF signal through an RF signal transmission path from an RF signal input interface of the RF cable through a cable body to an RF signal output interface of a connector housing of the RF cable, measuring, by a power measurement device integrated into the connector housing, a power value of an RF signal transmitted through the RF signal transmission path, and generating, by the power measurement device, a measurement signal indicating the measured power value of the RF signal. The method further involves outputting the generated measurement signal at a measurement signal output interface of the RF cable.

One idea of the present invention is to determine cable-bound power losses within the RF cable itself without having to disconnect the cable from the interconnected equipment for external power measurements. By measuring a power value of an RF signal transmitted through the RF cable directly at the output portion of the RF signal, cumbersome and time-consuming unplugging and replugging operations for connecting to external power meters is no longer needed. Due to the communication of the measurement results within the same RF cable, no further cables or other communication means are necessary.

Amongst others, there are several specific advantages associated with such RF cables, their use in testing systems and the respective methods of determining cable-bound path losses. The whole installation may become smaller and more inexpensive. Additionally, the determination of path losses may be performed in real-time without having to rely on separate power measurements between testing operations.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the accompanying drawings. Elements in the drawings are illustrated for simplicity and clarity and have not necessarily been drawn to scale.

FIG. 1 schematically illustrates a testing system for testing a DUT according to an embodiment of the invention.

FIG. 2 schematically illustrates an RF cable according to a further embodiment of the invention for use in a testing system.

FIG. 3 shows a flowchart of procedural stages of a method for determining a cable-bound path loss according to a further embodiment of the invention.

In all figures of the drawings elements, features and components which are the same or at least have the same functionality have been provided with the same reference symbols, unless explicitly stated otherwise.

DETAILED DESCRIPTION OF THE EMBODIMENTS

Mobile communication devices within the meaning of the present invention include any mobile electronic equipment capable of wirelessly communicating via a mobile communication network. Mobile communication devices may include laptops, notebooks, tablets, smartphones, mobile phones, pagers, PDAs, digital still cameras, digital video cameras, portable media players, gaming consoles, virtual reality glasses, mobile PCs, mobile modems, machine-to-machine (M2M) devices and similar electronic equipment.

FIG. 1 schematically illustrates a testing system 1. The testing system 1 may for example be an over-the-air (OTA) testing system which is able to perform measurement schemes for testing radio communication capabilities of electronic devices under test. In particular, the testing system 1 may be able to implement radiated two-stage (RTS) MIMO OTA measurement schemes. The testing system 1 may be employed as a universal tester for testing air interfaces of wireless devices in all phases of product development and production, thereby supporting all common cellular and non-cellular wireless technologies, including broadcast technologies, satellite navigation and wireless connectivity technologies. Among those technologies may be specific protocols such as GPS, LTE FDD/TDD, Mobile WiMAX™, TD-SCDMA, CDMA2000® 1×RTT, CDMA2000® 1×EV-DO, WCDMA/HSPA, HSPA+, GSM, GPRS, EDGE, EDGE Evolution, WLAN a/b/g/n, Bluetooth®, DVB-T, CMMB, FM Stereo and T-DMB.

The testing system 1 may particularly be configured and adapted to perform a testing method 20 as shown and explained in conjunction with FIG. 3 below. The testing system 1 includes a test controller 2 coupled to one or more antennas in a testing chamber 4. The testing chamber 4 may for example be an anechoic chamber the inner walls of which may be covered with anechoic material. Within the testing chamber 4 a probe antenna 3 may be arranged, the probe antenna 3 being coupled to and controlled by the test controller 2. To that end, the test controller 2 may include a signal generator and analyzer 7 that is configured to generate signals P to be transmitted via the probe antenna 3 and to process signals B received via the probe antenna 3. The test controller 2 may for example be adapted to maintain a probe link PL to the probe antenna 3. Of course, there may be more than one probe antenna 3 and the probe antenna 3 may also be implemented as antenna array, for example a MIMO antenna array.

The signal generator and analyzer 7 may act as a testing front end module that is operationally connectable to one or more mobile communication devices 10 under test. The test controller 2 may control the signal generator and analyzer 7 to output testing signals or to receive probing signals in order to measure gain levels for antennas or antenna state patterns set in the mobile communication device 10. The signal generator and analyzer 7 may generally comprise one or more vector signal generators (VSG) for generating and outputting testing signals to the mobile communication devices 10 operatively connected to the test controller 2. Furthermore, the signal generator and analyzer 7 may comprise one or more a vector signal analyzers (VSA) for receiving, filtering and evaluating testing response signals from the mobile communication devices 10 as response to one of the testing signals output by the VSG(s). The test controller 2 may in particular emulate a base station of a mobile communication network for testing proper functionality of the connected mobile communication device 10 with regard to network provisioning, network accessibility and network communication.

The test controller 2 may further be configured to measure spatially resolved gain values of antennas and/or antenna patterns in the mobile communication device 10. For example, if the mobile communication device 10 includes an active phased antenna array (AAS), the test controller 2 may be configured to measure antenna patterns of the AAS depending on the beamforming/beamsteering settings for the AAS in the mobile communication device 10. To that end, the mobile communication device 10 may be mounted on a three-dimensionally rotatable holder platform 8 that allows for orienting the mobile communication device 10 in any spatial orientation within the testing chamber 4 as desired. The holder platform 8 may be under control of a platform controller 9 outside the testing chamber 4 that is configured to position the mobile communication device 10 in any desired spatial orientation.

The platform controller 9 is coupled back to the test controller 2 in order to be able to control the platform controller 9 according to a predefined schedule of spatial orientation patterns. For example, the test controller 2 may be configured to set beamforming properties of an AAS of the mobile communication device 10 to a predefined setting that is maintained during an antenna pattern measurement schedule via the probe antenna 3 during which the platform controller 9 is controlled to set the holder platform 8 to scan the predefined schedule of spatial orientation patterns. In that manner, the test controller 2 may gather sets of angularly and spatially resolved gain maps of the antennas in the AAS of the mobile communication device 10 as a function of the set of beamforming properties of the AAS. Of course, it may be possible for the test controller 2 to instruct the platform controller 9 in order to position the mobile communication device 10 in a specific manner depending on other testing scheme conditions as well.

Data for the antenna or antenna pattern measurements that are collected on the mobile communication device 10 in a test mode may be transferred to the test controller 2 OTA. To that end, an uplink antenna 5 may be additionally placed in the testing chamber 4 in order to maintain an active uplink air interface TL during antenna or antenna pattern measurements. For example, an IP data connection with an associated client application may be used to transfer data from the mobile communication device 10 to the test controller 2 during or after the tests.

The testing system 1 may further comprise a channel emulator 6 that is configured to emulate communication channels of a base station with the mobile communication device 10. The emulated communication channels are designed to match realistic conditions of the communication between the mobile communication device 10 and a real base station. The emulation of the communication channels is performed by a channel model generator 6b that generates a channel model to be fed to the signal generator and analyzer 7 of the test controller 2 to emit testing signals to the mobile communication device 10.

The channel model may be based on fading profiles generated by a fading profile generator 6a coupled to the channel model generator 6b. The fading profile generator 6a may be configured to generate the fading profiles on the basis of pre-stored base fading profiles. Those base fading profiles may for example be standardized fading profiles that represent typical fading conditions in predetermined environments, such as Urban Macro (UMa) or Urban Micro (UMi).

For conveying signals between the different components of the testing system 1, such as between the channel emulator 6 and the test controller 2, between the test controller 2 and the probe antenna, between the test controller 2 and the platform controller 9, between the platform controller 9 and the platform holder 8, between the test controller 2 and the mobile communication device 10, and between the channel emulator 6 and the mobile communication device 10, RF cables 20 may be employed. For example, if signals from the channel emulator 6 are to be sent to the mobile communication device 10, RF cables 20 may be connected between outputs of the channel emulator 6 and temporary antenna connectors of the mobile communication device 10. The same holds true for transmitting signals between the test controller 2 and the probe antenna 3 where an RF cable 20 may be connected between outputs of the test controller 2 and inputs of the testing chamber 4.

FIG. 2 schematically depicts an RF cable 20 in a functional illustration. The actual dimensions of the RF cable 20 may not be displayed on scale in FIG. 2. Specifically, the RF cable 20 illustrated in FIG. 2 may be employed in order to connect components of the testing system 1 as depicted and explained in conjunction with FIG. 1. Moreover, the RF cable 20 of FIG. 2 may be used in a method for determining cable-bound path losses as depicted and explained in conjunction with FIG. 3.

The RF cable 20 includes generally a cable body 22 with a first end portion and a second end portion. The first end portion terminates in a connector housing 21 having an RF signal output interface 25a. The second end portion of the cable body may have an RF signal input interface 26a. RF signals may be transmitted from the RF signal input interface 26a through the cable body 22 and the connector housing to the RF signal output interface 25. For example, the RF signal input interface 26a may be connected to an RF port of a test controller 2 (or another component of a testing system 1). The RF cable 20 may be used to convey RF signals from the test controller 2 to a mobile communication device 10 to be tested, i.e. the RF signal output interface 25 may be connected to a respective input port of the mobile communication device 10.

The RF signal is therefore transmitted on an RF signal transmission path 23 within the RF cable 20. To that end, the RF cable 20 may be electromagnetically shielded, for example by equipping the cable body 22 and/or the connector housing 21 with an electromagnetic shielding barrier. The RF signal transmission path 23 may be implemented with a dedicated cable core carrying the RF signal transmission path 23.

The connector housing 21 has an integrated power measurement device 24. The power measurement device 24 is used to measure a power value of an RF signal transmitted through the RF signal transmission path 23. The power measurement device 24 may for example include a power sensor 24a and a power meter 24b coupled to the power sensor 24a. The power sensor 24a may for example be a thermistor, a thermocouple or a diode detector circuit. Such components may convert the RF signal on the RF signal transmission path 23 to a DC or low frequency signal. The power meter 24b may then measure the converted DC or low frequency signal and may determine the current or momentaneous power value of the RF signal from the value of the DC or low frequency signal. The power meter 24b may in particular be used to output a digital measurement signal indicating the measured power value of the RF signal. The power meter 24b may include a general-purpose processor, for example a central processing unit, an ASIC, a FPGA or any similar programmable logic device.

The RF cable 20 further includes one or more measurement signal output interfaces. Such measurement signal output interfaces are physical interfaces of the RF cable 20, such as a further pin, cable core or transmission line of the RF cable 20. For example, a measurement signal output interface 25b may be located in the connector housing 21, parallel to the RF signal output interface 25a. Alternatively or additionally, a measurement signal output interface 26b may be located at the second end portion of the cable body 22, i.e. parallel to the RF signal input interface 26a.

One or more measurement signal transmission lines 29a, 29b connect the power measurement device 24 to the measurement signal output interfaces 26b, 25b, respectively. The power measurement device 24 may output the measurement signals indicating the measured power value of the RF signal at one or both of the measurement signal output interfaces 26b, 25b. The measurement signal transmission lines 29a, 29b may be formed on a dedicated cable core of the RF cable 20. This dedicated cable core may be a separate cable core from the cable core carrying the RF signal transmission path 23.

It may be possible for the RF signal input interface 26a to implement splitter functionalities, i.e. a portion of the RF signal to be transmitted over the RF signal transmission path 23 is split from the RF signal and routed over a sensor line 20 in the RF cable directly to the power sensor 24a. In that manner, the RF signal transmission path 23 may remain essentially unperturbed and the measurements of the power measurement device 24 may be more accurate.

Mobile communication devices such as the mobile communication device 10 of FIG. 1 may need to be tested with respect to the antennas after manufacture and before shipping in order to ensure proper functionality and desired characteristics of the antennas. Such testing may be performed with the testing system 1 of FIG. 1. In order to determine cable-bound path losses in the RF cables used for connecting testing equipment among each other and/or with the mobile communication device 10 under test, a method 30 as described further below in conjunction with FIG. 3 may be implemented. The mobile communication device 10 of FIG. 1 may serve as device under test (DUT) for the testing system 1 in which RF cables 20 as depicted and explained in conjunction with FIG. 2 are installed.

In a first stage 31, an RF signal is transmitted through an RF signal transmission path 23 from an RF signal input interface 26a of the RF cable 20 through a cable body 22 to an RF signal output interface 25 of a connector housing 21 of the RF cable 20. In a second stage 32, a power measurement device 24 which is integrated into the connector housing 21 is used to measure a power value of an RF signal transmitted through the RF signal transmission path 23.

In a third stage 33, the power measurement device 24 generates a measurement signal which indicates the measured power value of the RF signal. This generating may for example be done by converting the RF signal to a DC or low frequency signal, for example using by a power sensor 24a of the power measurement device 24, such as thermistor, thermocouple or diode detector circuit. The converted DC or low frequency signal may then be measured by a power meter 24b of the power measurement device 24 in order to determine the power value of the RF signal.

In a fourth stage 34, the method 30 involves outputting the generated measurement signal at a measurement signal output interface of the RF cable 20. This measurement signal output interface may for example be located in the connector housing 21. Alternatively, the measurement signal output interface may be located at an end portion of the cable body 22 which end portion comprises the RF signal input interface 26a. Specifically, the measurement signal output interface may be a physical interface of the RF cable 20, such as a further pin, cable core or transmission line of the RF cable 20.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between various elements as shown and described with respect to the drawings may be a type of connection suitable to transfer signals from or to the respective nodes, units or devices, for example via intermediate devices. Accordingly, unless implied or stated otherwise the connections may for example be direct connections or indirect connections.

Because the apparatuses implementing the present invention are, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Also, the invention is not limited to physical devices or units implemented in non-programmable hardware, but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device. Those skilled in the art will recognize that the boundaries between logic or functional blocks are merely illustrative and that alternative embodiments may merge logic or functional blocks or impose an alternate decomposition of functionality upon various logic or functional blocks.

In the description, any reference signs shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried out, unless specifically recited in the claim.

Skilled artisans will appreciate that the illustrations of chosen elements in the drawings are only used to help to improve the understanding of the functionality and the arrangements of these elements in various embodiments of the present invention. Also, common and well understood elements that are useful or necessary in a commercially feasible embodiment are generally not depicted in the drawings in order to facilitate the understanding of the technical concept of these various embodiments of the present invention. It will further be appreciated that certain procedural stages in the described methods may be described or depicted in a particular order of occurrence while those skilled in the art will understand that such specificity with respect to sequence is not actually required.

What is claimed is:

1. A radio-frequency, RF, cable, comprising:
    a connector housing having an RF signal output interface;
    a cable body having a first end portion connected to the connector housing and a second end portion comprising an RF signal input interface;
    an RF signal transmission path formed from the RF signal input interface through the cable body and the connector housing to the RF signal output interface;
    a power measurement device integrated into the connector housing and configured to measure a power value of an RF signal transmitted through the RF signal transmission path,
    a measurement signal output interface located in the connector housing or at the second end portion of the cable body; and
    a measurement signal transmission line connecting the power measurement device to the measurement signal output interface, the power measurement device being configured to output a measurement signal indicating the measured power value of the RF signal at the measurement signal output interface.

2. The RF cable of claim 1, the power measurement device comprising:

a power sensor configured to convert the RF signal to a DC or low frequency signal; and a power meter coupled to the power sensor and configured to measure the DC or low frequency signal in order to determine the power value of the RF signal.

3. The RF cable of claim 2, wherein the power sensor comprises a thermistor, a thermocouple or a diode detector circuit.

4. The RF cable of claim 2, wherein the power meter is configured to convert the analog DC or low frequency signal into a digital measurement signal indicating the measured power value of the RF signal.

5. The RF cable of claim 1, wherein the cable body comprises an electromagnetic shielding barrier.

6. The RF cable of claim 1, wherein the connector housing comprises an electromagnetic shielding barrier.

7. The RF cable of claim 1, the cable body comprising at least two cable cores, a first one of the cable cores carrying the RF signal transmission path and a second of the cable cores carrying the measurement signal transmission line.

8. A testing system for testing one or more mobile communication devices, the testing system comprising:
a test controller comprising a signal generator and analyzer;
a testing chamber;
one or more mobile communication devices under test placed in the testing chamber; and
one or more radio-frequency, RF, cables comprising a connector housing having an RF signal output interface; a cable body having a first end portion connected to the connector housing and a second end portion comprising an RF signal input interface; an RF signal transmission path formed from the RF signal input interface through the cable body and the connector housing to the RF signal output interface; a power measurement device integrated into the connector housing and configured to measure a power value of an RF signal transmitted through the RF signal transmission path; a measurement signal output interface located in the connector housing or at the second end portion of the cable body; and a measurement signal transmission line connecting the power measurement device to the measurement signal output interface, the power measurement device being configured to output a measurement signal indicating the measured power value of the RF signal at the measurement signal output interface, wherein the one or more RF cables interconnecting the test controller, the testing chamber and the one or more mobile communication devices under test.

9. The testing system claim 8, wherein the testing chamber comprises a probe antenna arranged within the testing chamber, the probe antenna being coupled to the test controller by one of the RF cables.

* * * * *